(12) United States Patent
Liu et al.

(10) Patent No.: US 9,035,451 B2
(45) Date of Patent: May 19, 2015

(54) WAFER LEVEL SEALING METHODS WITH DIFFERENT VACUUM LEVELS FOR MEMS SENSORS

(71) Applicant: Taiwan Semiconductor Manufacturing Co., Ltd., Hsin-Chu (TW)

(72) Inventors: Yu-Chia Liu, Kaohsiung (TW); Chia-Hua Chu, Zhubei (TW); Kuei-Sung Chang, Kaohsiung (TW); Chun-Wen Cheng, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/041,298

(22) Filed: Sep. 30, 2013

(65) Prior Publication Data
US 2015/0091153 A1    Apr. 2, 2015

(51) Int. Cl.
| B81B 7/00 | (2006.01) |
| B81B 3/00 | (2006.01) |
| H01L 29/84 | (2006.01) |
| H01L 21/02 | (2006.01) |
| B81C 1/00 | (2006.01) |

(52) U.S. Cl.
CPC ............ *B81C 1/00293* (2013.01); *B81B 7/0041* (2013.01); *B81C 2203/0145* (2013.01); *B81B 7/0032* (2013.01); *B81B 3/0018* (2013.01); *B81B 3/0059* (2013.01); *B81B 3/0067* (2013.01); *H01L 29/84* (2013.01); *B81C 1/00158* (2013.01)

(58) Field of Classification Search
USPC .................................. 257/410–420, 700–710
See application file for complete search history.

(56) References Cited

U.S. PATENT DOCUMENTS

| 8,580,594 B2 | 11/2013 | Huang et al. |
| 2011/0215435 A1 | 9/2011 | Wakimoto et al. |
| 2012/0043627 A1* | 2/2012 | Lin et al. .................... 257/415 |
| 2012/0326248 A1* | 12/2012 | Daneman et al. ............ 257/415 |
| 2013/0001710 A1* | 1/2013 | Daneman et al. ............ 257/415 |
| 2013/0037891 A1 | 2/2013 | Huang et al. |
| 2013/0099355 A1 | 4/2013 | Liu et al. |

(Continued)

OTHER PUBLICATIONS

Non Final Office Action Dated Aug. 13, 2014 U.S. Appl. No. 14/013,155.

(Continued)

*Primary Examiner* — Howard Weiss
*Assistant Examiner* — Nelson Garces
(74) *Attorney, Agent, or Firm* — Eschweiler & Associates, LLC

(57) ABSTRACT

The present disclosure relates to a method of forming a plurality of MEMs device having a plurality of cavities with different pressures on a wafer package system, and an associated apparatus. In some embodiments, the method is performed by providing a work-piece having a plurality of microelectromechanical system (MEMs) devices. A cap wafer is bonded onto the work-piece in a first ambient environment having a first pressure. The bonding forms a plurality of cavities abutting the plurality of MEMs devices, which are held at the first pressure. One or more openings are formed in one or more of the plurality of cavities leading to a gas flow path that could be held at a pressure level different from the first pressure. The one or more openings in the one or more of the plurality of cavities are then sealed in a different ambient environment having a different pressure, thereby causing the one or more of the plurality of cavities to be held at the different pressure.

20 Claims, 14 Drawing Sheets

(56) References Cited

U.S. PATENT DOCUMENTS

2013/0277770 A1    10/2013   Tsai et al.
2014/0103461 A1*   4/2014    Chu et al. .................. 257/415
2014/0225206 A1*   8/2014    Lin et al. .................. 257/417
2014/0248730 A1    9/2014    Huang et al.

OTHER PUBLICATIONS

U.S. Appl. No. 14/013,155, filed Aug. 29, 2013. 26 Pages.
U.S. Appl. No. 14/557,513, filed Dec. 2, 2014.
U.S. Appl. No. 14/629,738, filed Feb. 24, 2015.
Notice of Allowance Dated Jan. 13, 2015 U.S. Appl. No. 14/013,155.

* cited by examiner

WAFER LEVEL SEALING METHODS WITH DIFFERENT VACUUM LEVELS FOR MEMS SENSORS

BACKGROUND

MEMs (microelectromechanical system) devices, such as accelerometers, pressure sensors, gyroscopes, etc., have found widespread using in many modern day electronic devices. For example, MEMS accelerometers are commonly found in automobiles (e.g., in airbag deployment systems), tablet computers, or in smart phones In recent years, it is increasingly common for Micro-Electro-Mechanical Systems (MEMS) to be incorporated into integrated chips formed by a complementary metal-oxide-semiconductor (CMOS) process. The incorporation of MEMS (e.g., sensors, integrated optics, biochips, etc.) into a CMOS process allows for widespread use of MEMS fabricated with a high throughput.

DETAILED DESCRIPTION

Figure 1:
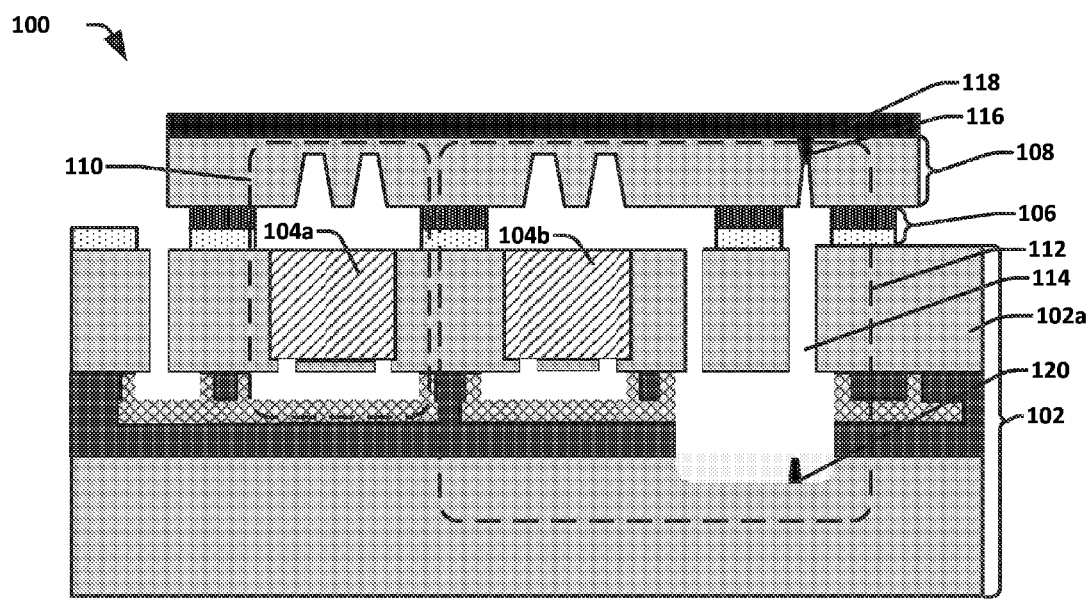
FIG. 1 illustrates a cross-sectional view of some embodiments of a wafer package system comprising two MEMS (microelectromechanical system) devices having cavities with different pressures.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

MEMS sensor devices often operate by sensing a characteristic of an environment surrounding the device. For example, to measure an angular momentum, a MEMS vibrational gyroscope may measure an angular rate by utilizing the Coriolis effect. To improve operation of a MEMS device, it may be desirable to operate at a specific pressure that enables improved measurement of a desired parameter. For example, in the case of a MEMs vibrational gyroscope, a lower pressure (i.e., a higher vacuum) provides for a better measurement since it mitigates background noise.

Therefore, MEMS devices typically have a hermetically-sealed cavity that is held at a controlled pressure level that enables operation of the device. The pressure level can range from a vacuum (e.g., 1 mtorr) to a few atmosphere (e.g., 2 atm) depending on device operation. When there is one MEMs device (e.g., an accelerometer) on a wafer, a wafer level method can be used to form the cavity under a pressure. However, when there are different types of devices on a same wafer (e.g., an accelerometer and gyro) the wafer level method is unable to package the devices with separate pressures.

Accordingly, the present disclosure relates to a method of forming a plurality of MEMs devices having cavities with different pressures on a wafer package system, and an associated apparatus. In some embodiments, the method comprises providing a work-piece having a plurality of microelectromechanical system (MEMs) devices. A cap wafer is bonded onto the work-piece in a first ambient environment having a first pressure. Bonding of the cap wafer forms a plurality of cavities abutting the plurality of MEMs devices. One or more openings are formed on the work-piece to create a gas flow path that fluidly couples (i.e., gaseous interaction) an opening in the cap wafer to one of the MEMs devices. The number of openings and/or the volume of these openings determine the vacuum level of the gas flow path and hence the pressure level inside the gas flow path. The opening on the cap wafer exposes the cavity having the gas flow path to a different ambient environment having a different pressure. The opening is then sealed, so that the cavity under that opening is held at the different pressure. The resulting wafer package system comprises a first cavity having a first pressure and a second cavity having a second different pressure.

FIG. 1 illustrates a block diagram of some embodiments of a substrate 100 comprising a plurality of MEMs devices, 104a and 104b, having cavities, 110 and 112, with different pressures.

The substrate 100 comprises a work-piece 102 having a plurality of MEMs (Microelectromechanical systems) devices, a first MEMs device 104a and a second MEMs device 104b, embedded therein. In some embodiments, one or more of the MEMS devices, 104a and 104b, may comprise a MEMs gyroscope (e.g., a vibrating gyroscope or a piezoelectric plate gyroscope) a MEMs accelerometer, a MEMs magnetic sensor or a MEMs RF resonator. The work-piece 102 includes a silicon region 102a over which the MEMs devices 104a and 104b are embedded.

A cap wafer 108 is disposed at a position overlaying the work-piece 102. The cap wafer 108 is affixed to the work-piece 102 by way of a bonding layer 106. The cap wafer 108 comprises a plurality of depressions that are positioned at locations that correspond to locations of the MEMs devices, 104a and 104b, so as to form cavities, 110 and 112, that abut the MEMs devices, 104a and 104b respectively.

In some embodiments, the first layer of bonding material 106 may comprise aluminum or germanium (for eutectic bond), oxide (for fusion bond), a metal or a polymer (for thermal compression bond), etc.

A gas flow path 114 that fluidly couples the second MEMs device 104b to an opening 116 on the cap wafer is disposed in the second cavity 112 (i.e., there is air/gas circulation between the outside environment and the second MEMs device through the opening in the cap wafer and the gas flow path).

In some embodiments, the first MEMs device 104a abuts a first cavity 110 and the second MEMs device 104b abuts a second cavity 112. The first cavity 110 is held at a first pressure. The first cavity 112 is defined in terms of the cap wafer 108, the bonding layer 106, and the work-piece 102. For example, in some embodiments, the first cavity 110 may comprise a top surface comprising the cap wafer 108 and sidewalls comprising the cap wafer 108 and the bonding layer 106.

The second cavity 112 is held at a second pressure different than the first pressure. The second cavity 112 is defined in terms of the cap wafer 108, the bonding layer 106, the work-piece 102, and a sealant 118. For example, in some embodiments, the sealant 118 is disposed to overlay the cap wafer 108 and extend from a top of the cap wafer 108 to a position that forms an interior surface of the second cavity 112. The opening 116 in the cap wafer and the gas flow path 114 coupled to the second MEMs device 104b keeps the vacuum level in the second cavity 112 different from that in the first cavity 110 and thus the first MEMs device 104a and the second MEMs device 104b will be set at two different pressures inside the wafer package system.

The sealant 118 that seals the second cavity to a different pressure may have some residue 120 that could fall in to the second cavity. Since the gas flow path is etched down to a level that is below the MEMs device 104b, this residue 120 will be collected at the bottom surface of the gas flow path and will not fall on the MEMs device. Thus the architecture of the wafer package system in the present disclosure prevents the sealant residue from affecting the MEMs device behavior.

In some embodiments, the work-piece 102 may comprise electrical interconnections configured to couple the MEMs devices, 104a and 104b, to one or more logic devices (e.g., CMOS transistors) that make the MEMs devices, 104a and 104b, function. For example, in some embodiments, the work-piece 102 may comprise one or more stacked wafers (e.g., a 2.5D integrated chip), wherein one or more stacked wafers comprise one or more logic devices that make the MEMs devices, 104a and 104b, function.

It will be appreciated that although the substrate of FIG. 1 is illustrated as having two cavities, 110 and 112, that are held at different pressures that the disclosed substrate is not limited to such a configuration. For example, in other embodiments, a disclosed substrate may comprise more than two cavities, wherein two or more of the cavities may be held at a same pressure.

Figure 2:
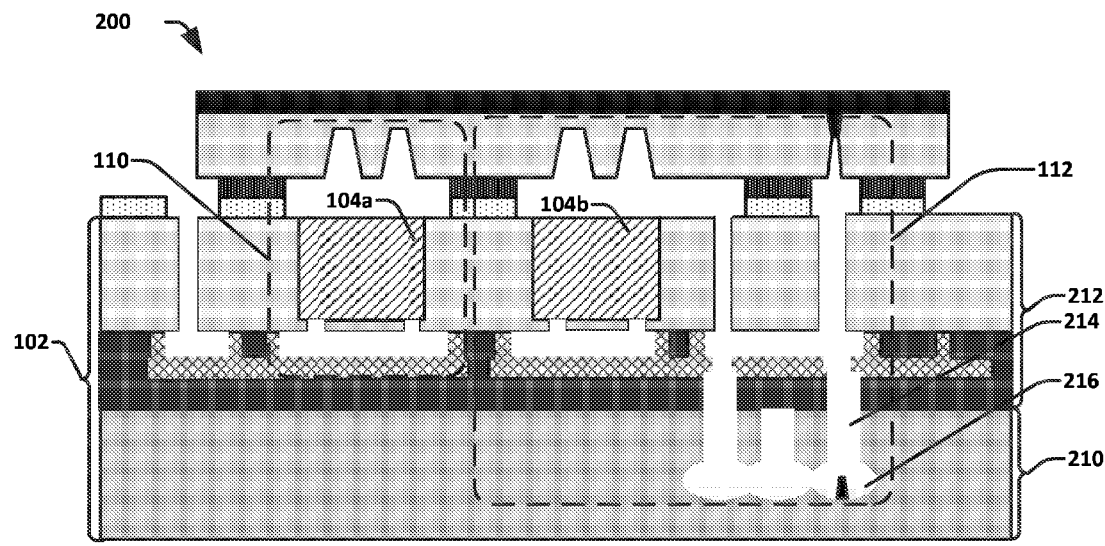
FIGS. 2-3 illustrate embodiments of two different architectures of a wafer package system comprising two MEMs devices having cavities with different pressures.
Figure 3:
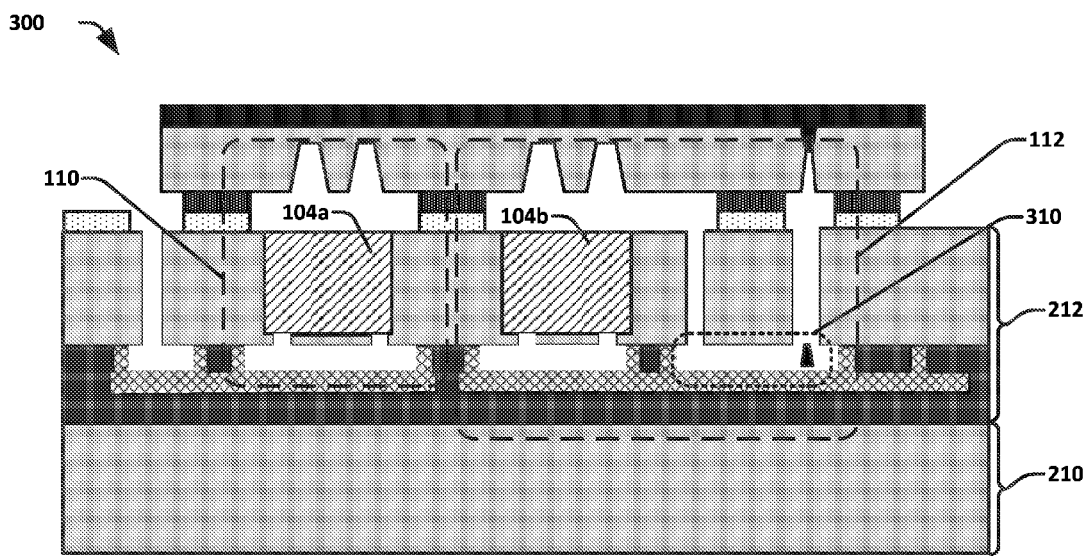

FIGS. 2-3 illustrate some more detailed embodiments of two different architectures of a wafer package system comprising a plurality of MEMs devices having cavities with different pressures.

FIG. 2 illustrates a cross-sectional view 200 of an embodiment of a wafer package system comprising a plurality of MEMs devices having different pressures. The work-piece 102 comprises a carrier wafer 210 and a MEMs wafer 212 overlaying the carrier wafer 210. As described in FIG. 1, the first MEMs device 104a abuts a first cavity 110 and the second MEMs device 104b abuts a second cavity 112. In this embodiment, the gas flow path coupling the second MEMs device 104b comprises one or more holes and one or more paths in the carrier wafer 210 that determines the vacuum level of the second cavity 112 and hence the pressure level in the second cavity 112. Reference numerals 214 and 216 depict a carrier wafer path and carrier wafer hole respectively. More details on the step by step construction of the wafer package system 200 will be illustrated later.

FIG. 3 illustrates a cross-sectional view 300 of an embodiment of a wafer package system comprising a plurality of MEMs devices having different pressures. In this embodiment, the gas flow path coupling the second MEMs device 104b comprises an oxide release channel 310 within the MEMs wafer 212 and the volume of the gas flow path including the oxide release channel 310 determines the pressure level of the second cavity 112. More details on the step by step construction of the wafer package system 300 will be illustrated later.

Figure 4A:
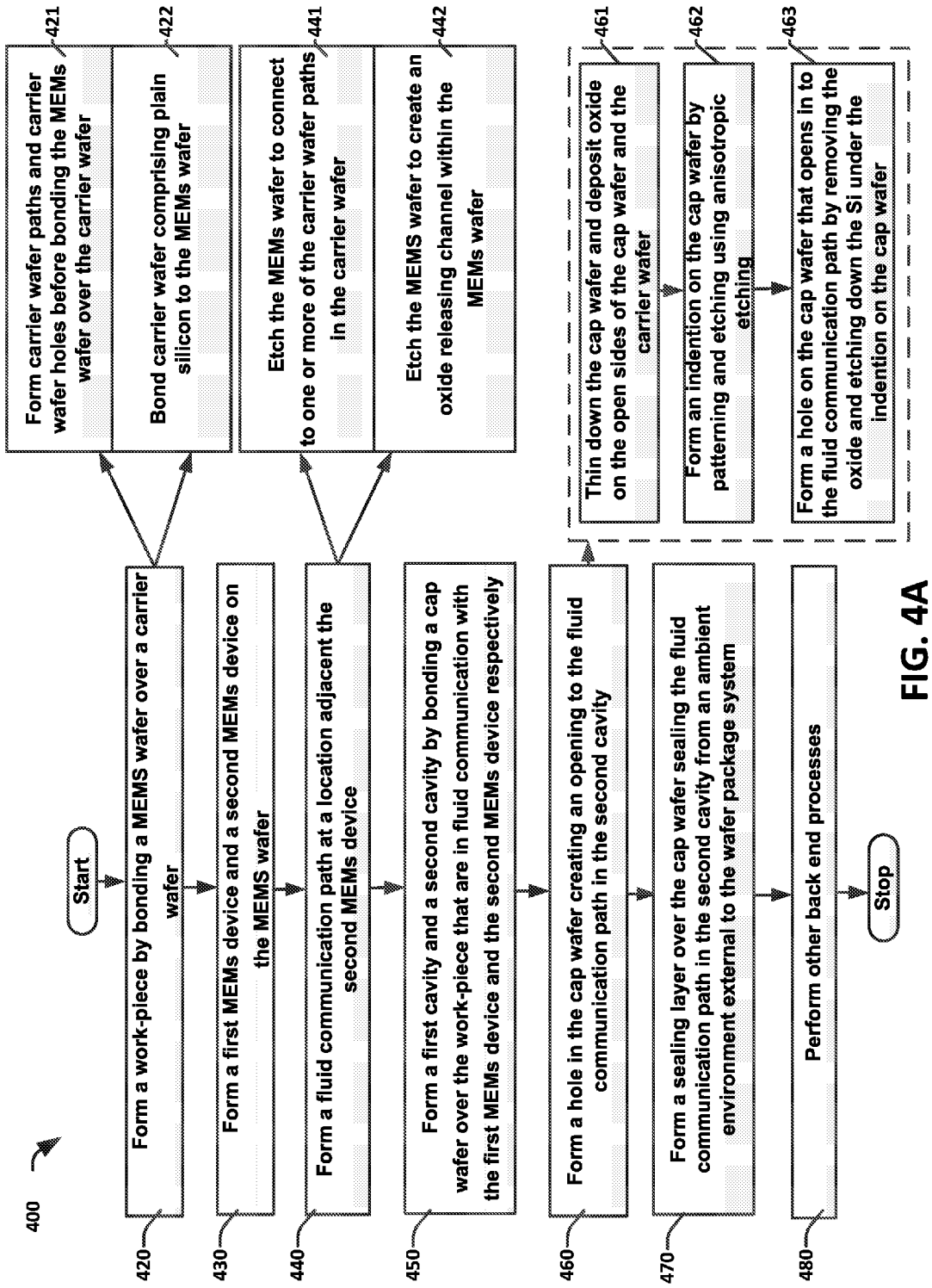
FIG. 4a illustrates a flow diagram of some embodiments of a method for forming two MEMs device having cavities with different pressures on a wafer package system.

FIG. 4a illustrates a flow diagram of some embodiments of a method 400 for forming a plurality of MEMs device having cavities with different pressures on a wafer package system.

While disclosed method 400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 420, a work-piece is formed by bonding a MEMs wafer over a carrier wafer. In some embodiments, the MEMs wafer may be bonded to the carrier wafer by way of a fusion bonding process, a eutectic bonding process, a thermal compression bonding process, etc.

Figure 4B:
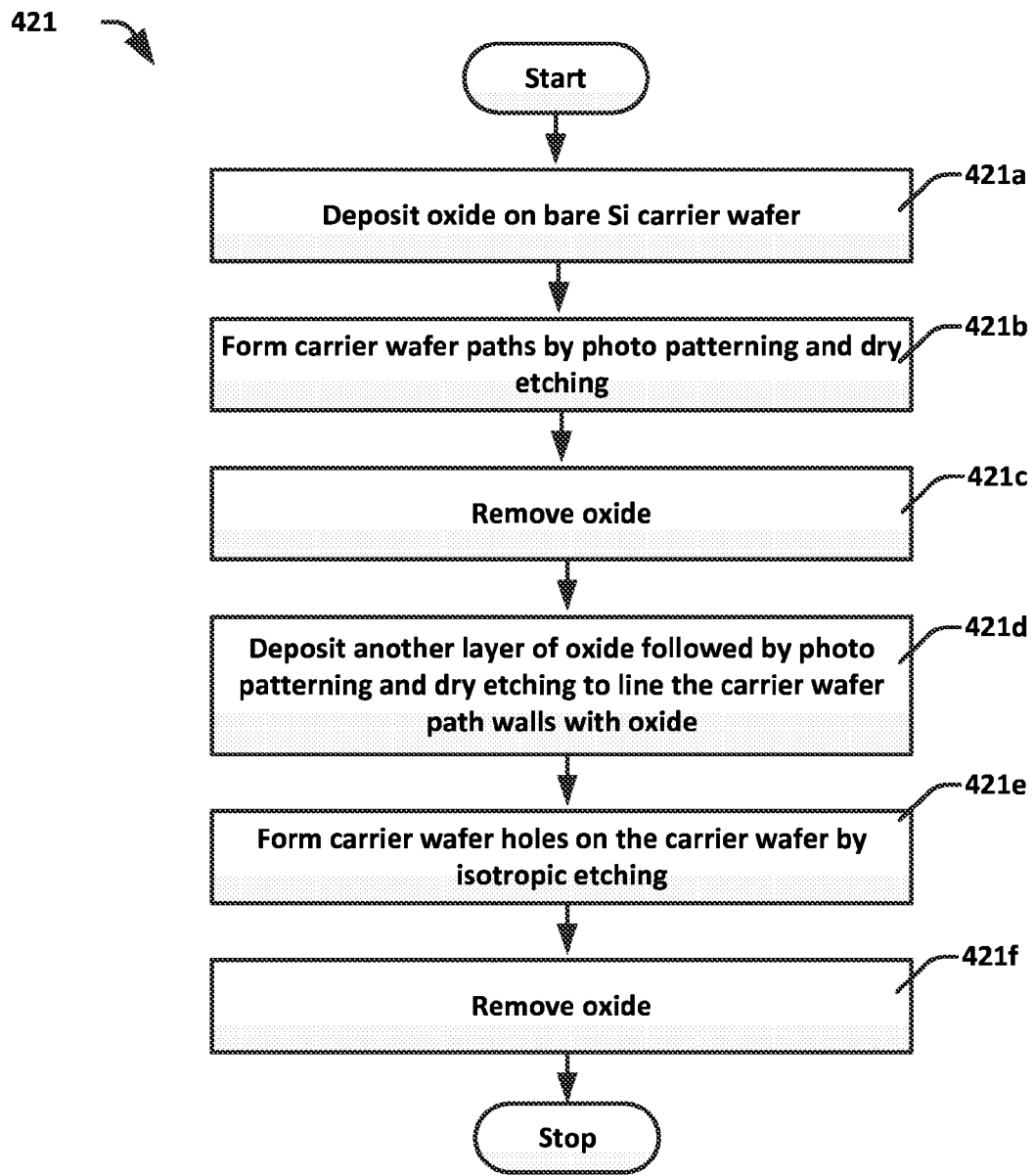
FIG. 4b shows an embodiment of method that illustrates the formation of carrier wafer holes and carrier wafer paths.

In some embodiments the carrier wafer undergoes a series of oxidation and lithography steps before it is bonded with the MEMs wafer. Step 421 illustrates one such embodiment of step 420 wherein carrier wafer holes and carrier wafer paths are created before they are joined with the MEMs wafer. FIG. 4b illustrates step 421 in detail.

Still referring to FIG. 4a, step 422 illustrates another embodiment of step 400 where a carrier wafer that comprises only Si and not any holes or paths is bonded with the MEMs wafer.

At step 430 of FIG. 4a, a first MEMs device and a second MEMs device are formed on the MEMs wafer. In some embodiments a series of steps comprising photolithography, oxidation, metallization etc. are carried out to create the MEMs devices.

At step 440, a gas flow path is formed on the MEMs wafer at a location that is near the second MEMs device. It is formed so that the second MEMs device has a different volume and a different vacuum level than the first MEMs device, so that when the gas flow path coupling the second MEMs device gets sealed, it is held at a pressure level different from that of the first MEMs device. It will be appreciated that although step 440 illustrates formation of the gas flow path near the second MEMs device, the disclosed method is not limited to such a criterion. For example, in other embodiments, a disclosed MEMs wafer may comprise more than two MEMs devices, wherein two or more of the MEMs devices are held at same or different pressures.

Steps 441 and 442 illustrate two different embodiments of step 440, wherein a gas flow path with different structural configurations are created. In one embodiment 441, the MEMs wafer is etched to create paths that connect to one or more of the carrier wafer paths in the carrier wafer. In another embodiment 442, the MEMs wafer is etched to create an oxide releasing channel within the MEMs wafer. In both these embodiments, the volume of the gas flow path controls the pressure level at which the second MEMs device is held.

At 450, a cap wafer is bonded to the work-piece to form a bonded wafer structure having a plurality of cavities at a first pressure. The cap wafer is bonded on to the work-piece creating a first and a second cavity that are in fluid communication (i.e., gaseous interaction) with the first and second MEMs devices respectively. The cap wafer is bonded to the work-piece by bringing the first layer of bonding material into contact with the second layer of bonding material at a first ambient environment having the first pressure. In some embodiments the cap wafer may be bonded with aluminum or germanium to form a eutectic bond.

At 460, a hole or an opening is formed on the cap wafer which opens into the gas flow path of the second cavity. This opening helps in controlling the vacuum level inside the second cavity. Formation of the hole in the cap wafer comprises a series of steps and they are illustrated as one embodiment in steps 461-463. At 461, the cap wafer if thinned down by time controlled etching and a protective oxide layer is deposited on the open sides of both the cap wafer and the carrier wafer. At 462, anisotropic etching is carried out to form an indention or a hole half way through the cap wafer. At 463, oxide from the open sides of the cap wafer and the carrier wafer is removed and another round of etching is carried out to create a hole that opens in to the gas flow path. This is done by patterning and etching the Si under the indention using isotropic etching.

At 470, a sealing layer is formed over the cap wafer that seals the hole on the cap wafer that sets the second cavity at an ambient pressure environment different from the first cavity. In some embodiments, the method further comprises sealing the one or more openings in the one or more of the plurality of cavities in a second ambient environment having a second pressure.

At 480, other back end processes are performed. In some embodiments, the other back end processes may comprise dicing the substrate to form a first MEMs device on a first die and a second MEMs device on a second die. In other embodiments, the other back end processes may comprise dicing the substrate to form the first and second MEMS device on a same die.

FIG. 4b shows an embodiment of method 421 that illustrates a series of steps carried out at step 421 of method 400, which illustrates the formation of carrier wafer holes and carrier wafer paths.

While disclosed method 421 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 421a, an oxide is deposited over a bare carrier wafer. In some embodiments the carrier wafer comprises silicon.

At 421b, carrier wafer paths are formed after photo patterning and dry etching.

At 421c, the oxide on top of the carrier wafer is removed using wet etching.

At 421d, another layer of oxide is deposited followed by photo patterning and dry etching so that the walls of the carrier wafer paths are lined with oxide. This oxide lining protects the sides of the paths from future etching steps.

At 421e, carrier wafer holes are formed by isotropic etching.

At 421f, the oxide is removed.

FIGS. 5A-5F illustrates embodiments of cross sectional images of the step by step formation of carrier holes and carrier paths as described in the method 421.

Figure 5A:
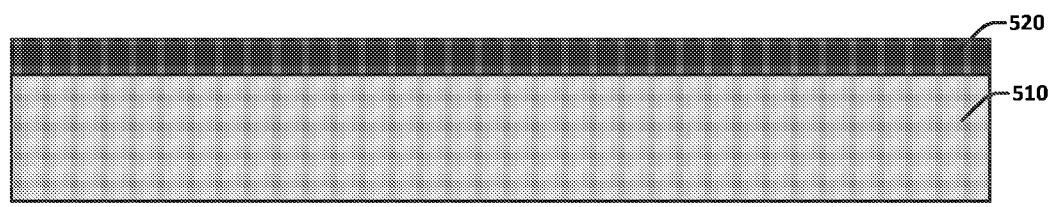
FIGS. 5A-5F illustrate embodiments of cross sectional images of a method of formation of carrier holes and carrier paths.

FIG. 5A shows an embodiment of a semiconductor body 500a that has an oxide layer 520 disposed over a silicon carrier wafer 510.

Figure 5B:
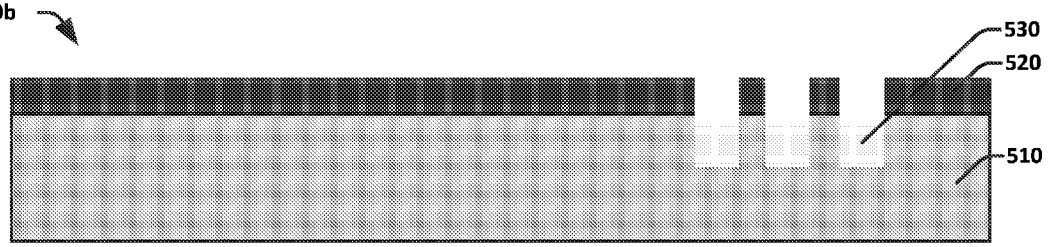

FIG. 5B shows an embodiment of a semiconductor body 500b after the formation of carrier wafer paths. Reference numeral 530 shows one of the carrier wafer paths. In another embodiment, one or more carrier wafer paths could be formed in the carrier wafer. In some embodiments the carrier wafer paths are formed by photo patterning followed by anisotropic etching.

Figure 5C:
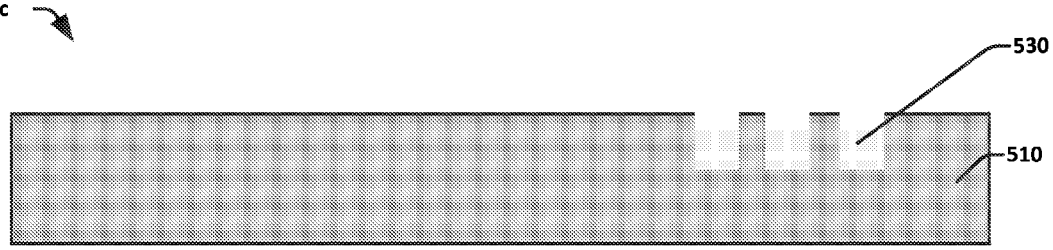

FIG. 5C shows an embodiment of a semiconductor body 500c after removal of the oxide.

Figure 5D:
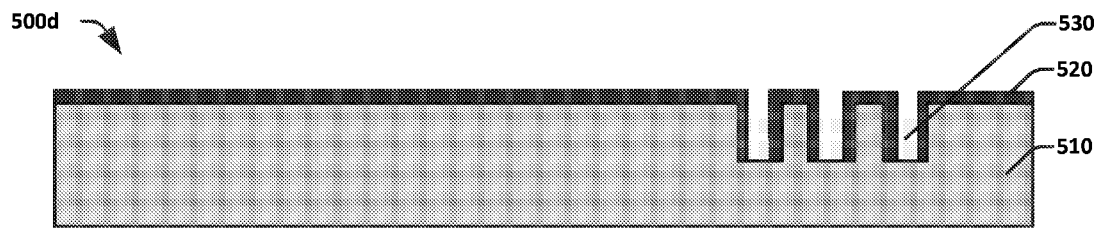

FIG. 5D shows an embodiment of a semiconductor body 500d after deposition of another oxide layer 520 and careful patterning and dry etching so that the walls of the carrier wafer paths 530 are lined with oxide while the oxide is removed from the bottom of the carrier wafer paths 530. This oxide lining protects the sides of the paths from future etching steps.

Figure 5E:
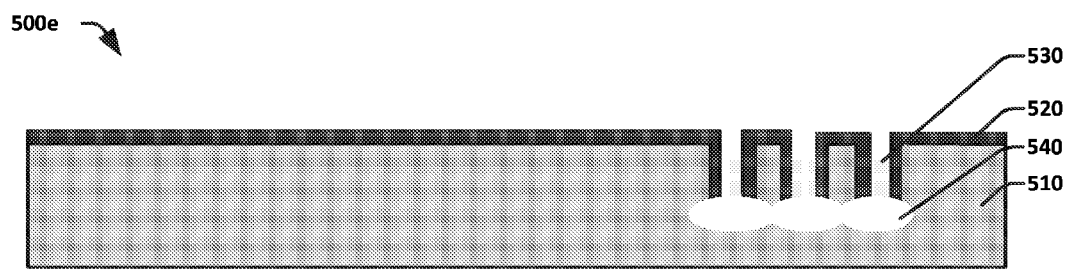

FIG. 5E shows an embodiment of a semiconductor body 500e after the isotropic etching step that creates one or more carrier wafer holes. Reference numeral 540 represents one of the carrier wafer holes.

Figure 5F:
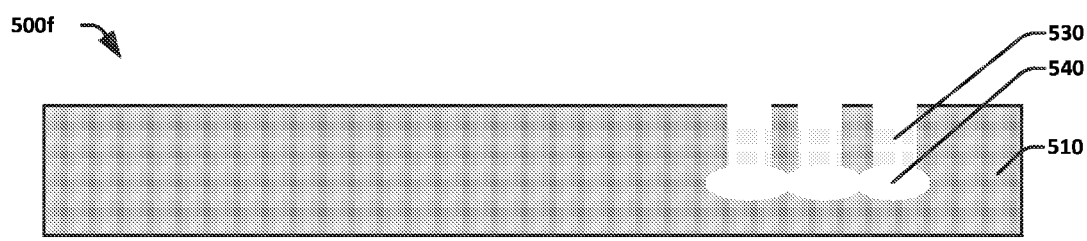

FIG. 5F shows an embodiment of a semiconductor body 500f after the oxide layer 520 is removed and the carrier wafer is left with carrier wafer holes and paths.

FIGS. 6A-6H show cross sectional images of various embodiments of corresponding method 400 including act 421, wherein the gas flow path comprises carrier wafer holes and carrier wafer paths.

Figure 6A:
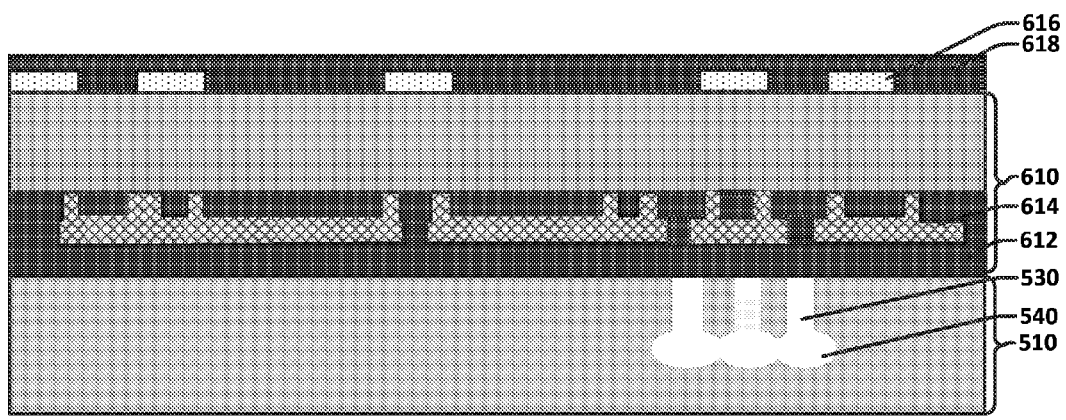
FIGS. 6A-6H show cross sectional images of some embodiments of a method for forming two MEMs device having cavities with different pressures on a wafer package system, wherein the gas flow path comprises carrier wafer holes and carrier wafer paths.

FIG. 6A shows an embodiment of a semiconductor body 600a after a MEMs wafer 610 is bonded over the carrier wafer 510. The MEMs wafer comprises a poly silicon region 614 and a MEMs oxide layer 612. Another oxide layer 618 resides on top of the MEMs wafer covering many aluminum metal contacts wherein, one of them is represented by the reference numeral 616.

Figure 6B:
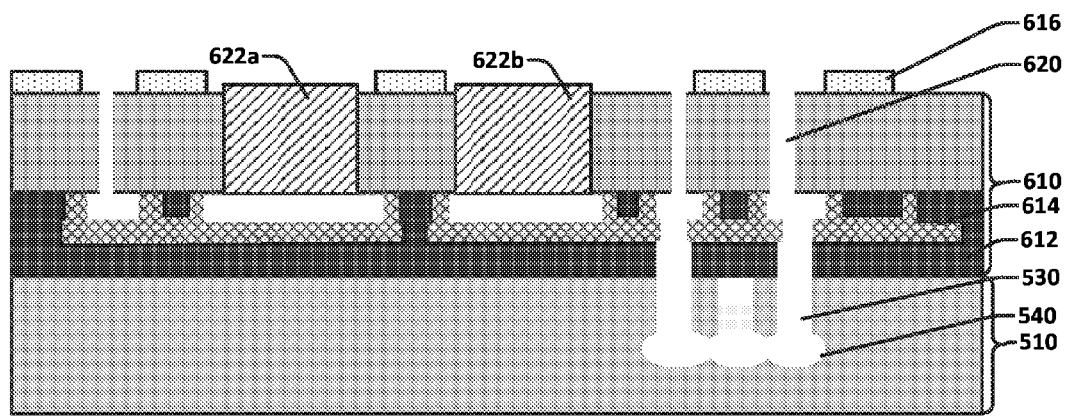

FIG. 6B shows an embodiment of a semiconductor body 600b after formation of a first MEMs device 622a and a second MEMs device 622b over the MEMs wafer 610. The oxide layer 618 of FIG. 6A is also removed through a dry etching step leaving the aluminum metal contacts open. The MEMs wafer is also carefully patterned and etched to create paths that connect to the carrier wafer paths 620 and constitute a gas flow path for the second MEMs device at a later stage.

Figure 6C:
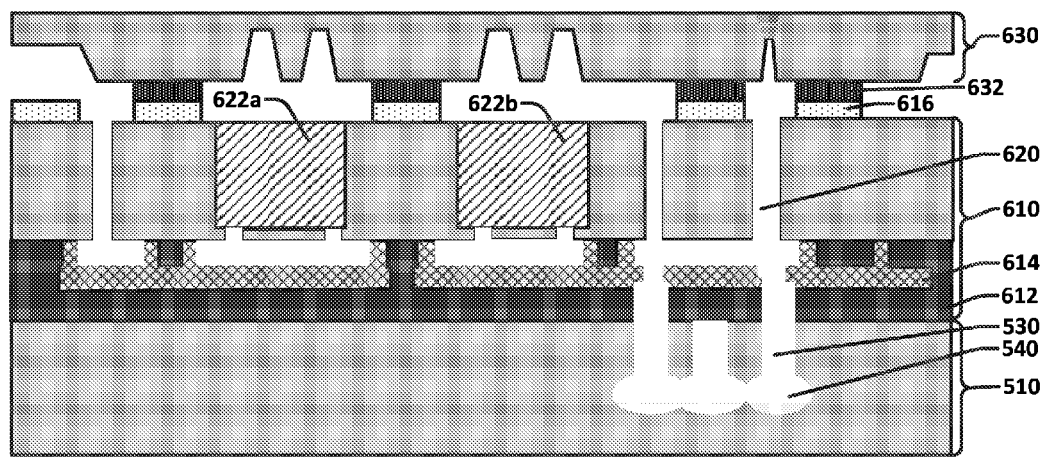

FIG. 6C shows an embodiment of a semiconductor body 600c after a cap layer is bonded over the MEMs wafer through eutectic bonding. The cap wafer 630 is bonded to the MEMs wafer to form a bonded wafer structure having a plurality of cavities at a first pressure. In one embodiment the cap wafer 630 has germanium metal contacts that can form eutectic bonds with the aluminum contacts over the MEMs wafer. Reference numeral 632 represents one of the germanium metal contacts.

Figure 6D:
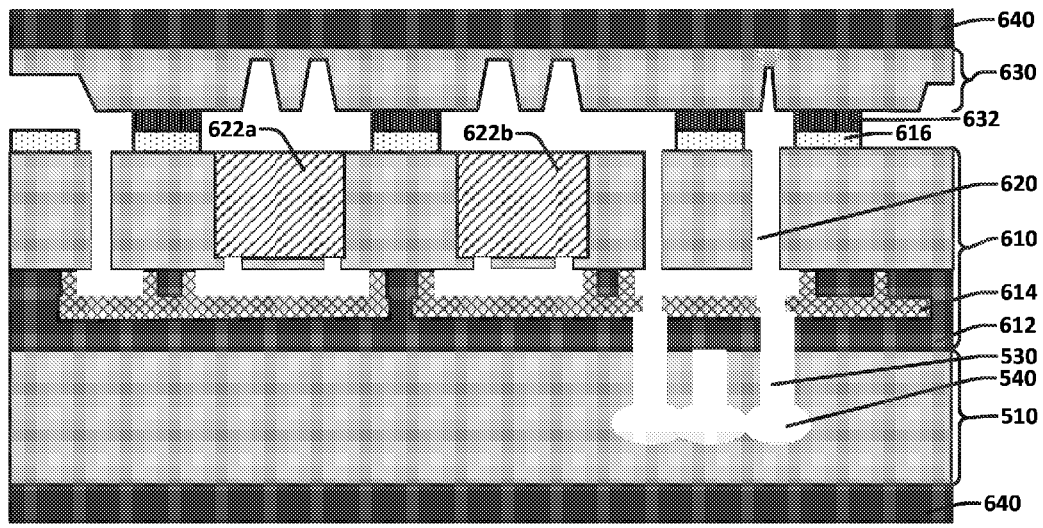

FIG. 6D shows an embodiment of a semiconductor body 600d after deposition of oxide 640 on the open sides of both the carrier wafer and the cap wafer. This is done to protect the silicon on both the ends of the carrier wafer and the cap wafer from the future etching step.

Figure 6E:
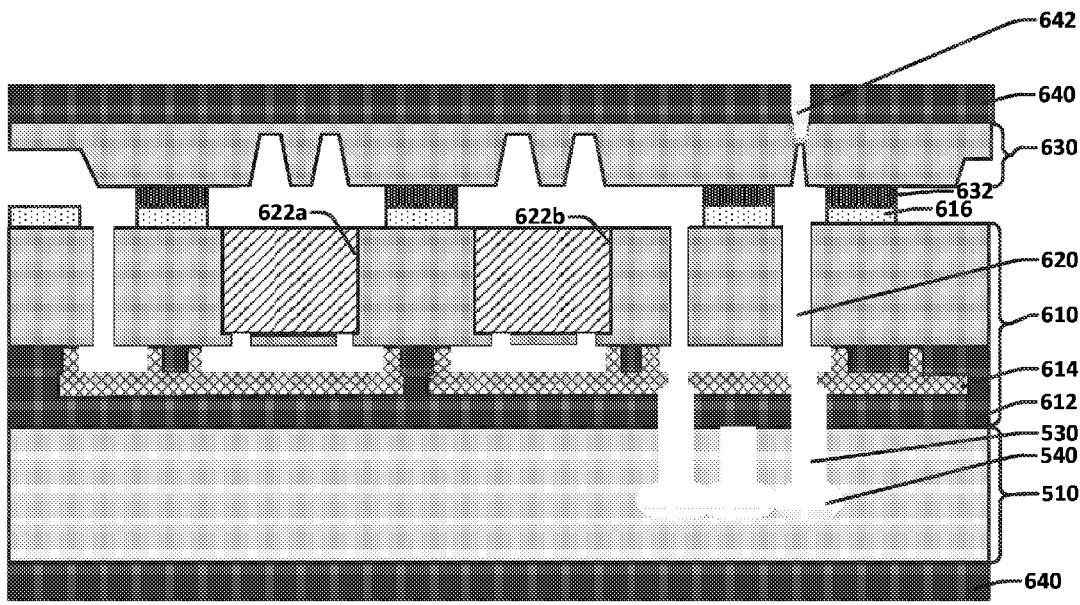

FIG. 6E shows an embodiment of a semiconductor body 600e after an anisotropic etching step that creates a small hole 642 on the cap wafer. This is the first step of a two-step etching process that creates a hole opening to the gas flow path which is in communication with the second MEMs device 622b.

Figure 6F:
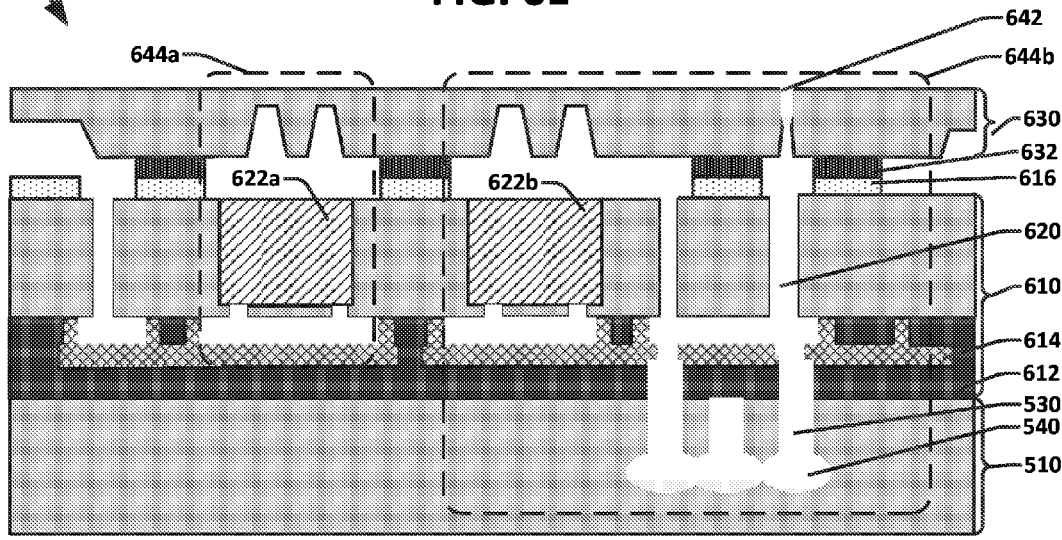

FIG. 6F shows an embodiment of a semiconductor body 600f after an isotropic etching step which completes the formation of the small hole 642 in the cap wafer that creates an opening to the gas flow path 620 which is in communication with the second MEMs device 622b. The hole 642 in the cap wafer opens the gas flow path 620 to an ambient environment that is different from the existing pressure and the amount of pressure could be controlled externally through the hole 642 as well as by the volume of the gas flow path. Thus the initial pressure level formed during the bonding of the cap wafer around the second MEMs device is changed, creating two cavities 644a and 644b around the first MEMs device 622a and the second MEMs device 622b that have a first pressure level and a different second pressure level respectively.

Figure 6G:
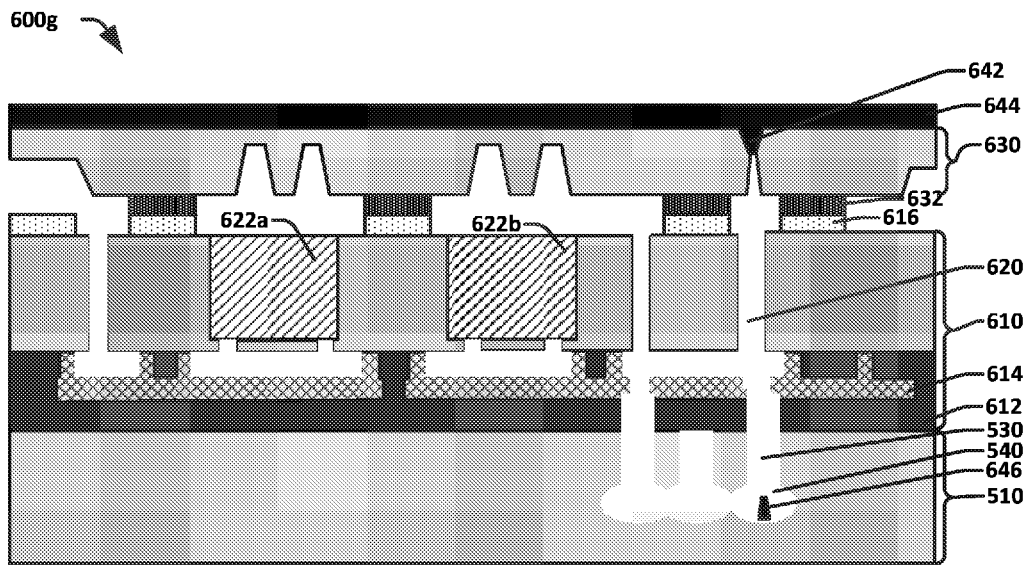

FIG. 6G shows an embodiment of a semiconductor body 600g after depositing a sealant 644 above the cap wafer 630 that seals the hole 642 and thus the second cavity 644b at a second different pressure level than that present in the first cavity 644a. Any residue that falls through the hole 642 into the second cavity will be collected at the bottom of the gas flow path and thus a sealant residue 646 is observed at the bottom of the gas flow path 620.

Figure 6H:
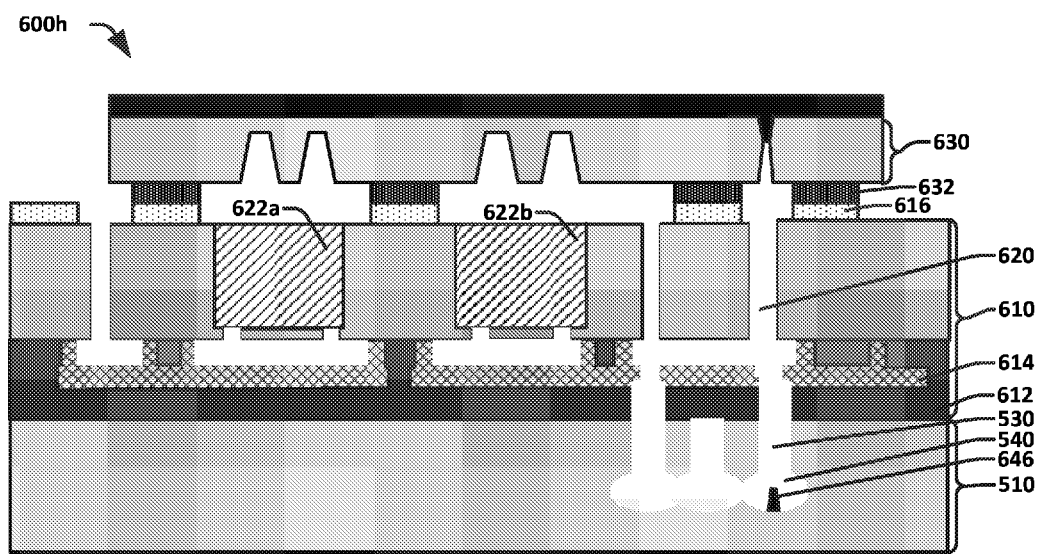

FIG. 6H shows an embodiment of a semiconductor body 600h after partial dicing of the cap wafer to expose one or more of the aluminum contacts 616 residing on top of the MEMs wafer 610.

FIGS. 7A-7I show cross sectional images of various embodiments corresponding to the method 400 of FIG. 4A including act 422 wherein the gas flow path comprises a sacrificial oxide layer in the MEMs wafer.

Figure 7A:
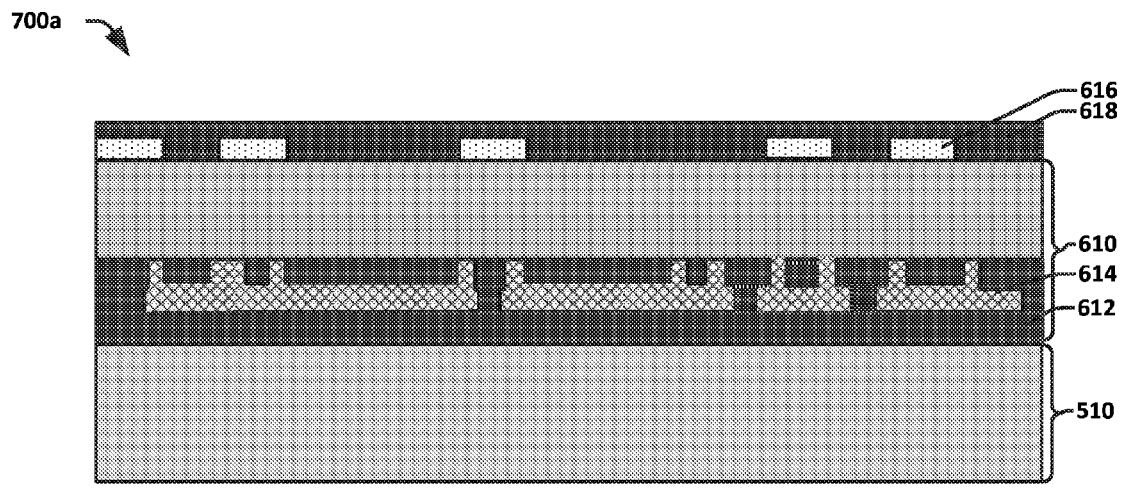
FIGS. 7A-7I show cross sectional images of some embodiments of a method for forming two MEMs device having cavities with different pressures on a wafer package system, wherein the gas flow path comprises a sacrificial oxide layer in the MEMs wafer.

FIG. 7A shows an embodiment of a semiconductor body 700a after a MEMs wafer 610 is bonded over the carrier wafer 510. The MEMs wafer comprises a poly silicon region 614 and a MEMs oxide layer 612. Another oxide layer 618 resides on top of the MEMs wafer covering many aluminum metal contacts wherein, one of them is represented by the reference numeral 616.

Figure 7C:
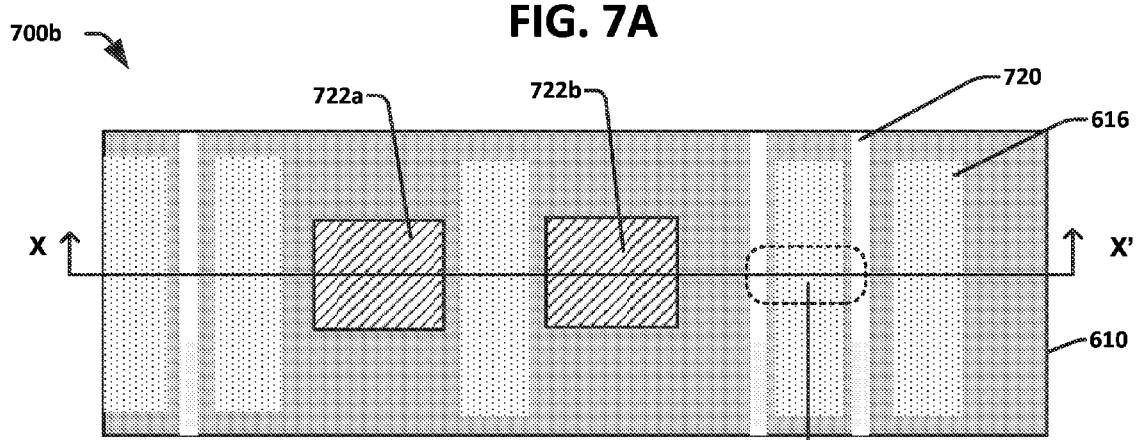
Figure 7B:
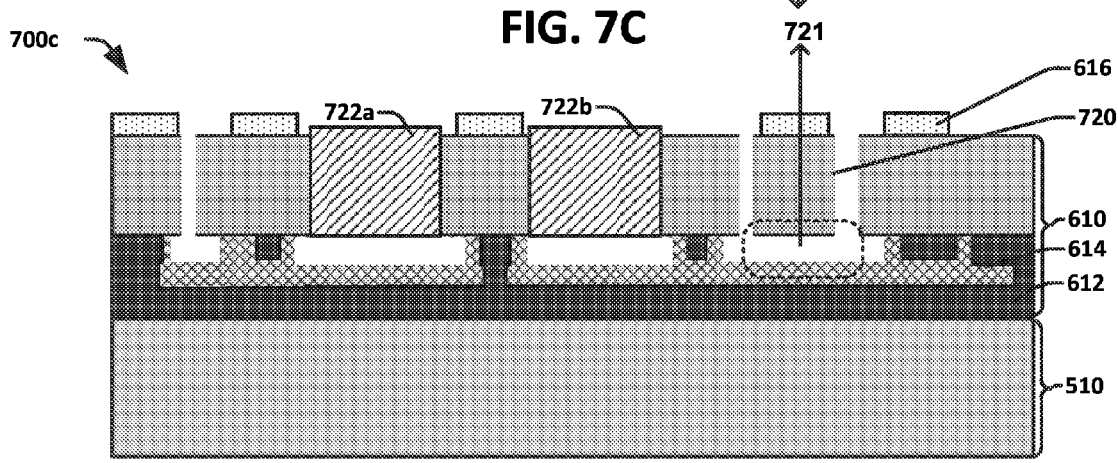

FIG. 7B shows an embodiment of a top view of a semiconductor body 700b after formation of a first MEMs device 722a and a second MEMs device 722b over the MEMs wafer 610. The oxide layer 618 is removed through an etching step leaving the aluminum metal contacts open. The MEMs wafer is also carefully patterned and etched to create an oxide release channel 721 which later constitutes a gas flow path 720 for the second MEMs device.

FIG. 7C shows an embodiment of a cross sectional view of a semiconductor body 700b across X-X'.

Figure 7D:
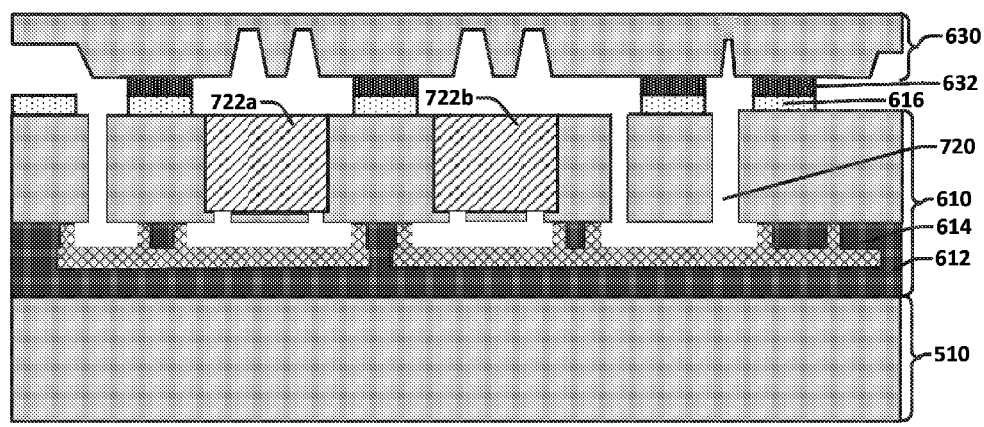

FIG. 7D shows an embodiment of a semiconductor body 700d after a cap layer is bonded over the MEMs wafer through eutectic bonding. The cap wafer 630 is bonded to the MEMs wafer to form a bonded wafer structure having a plurality of cavities at a first pressure. The cap wafer 630 has germanium metal contacts that can form eutectic bonds with the aluminum contacts over the MEMs wafer. Reference numeral 632 represents one of the germanium metal contacts.

Figure 7E:
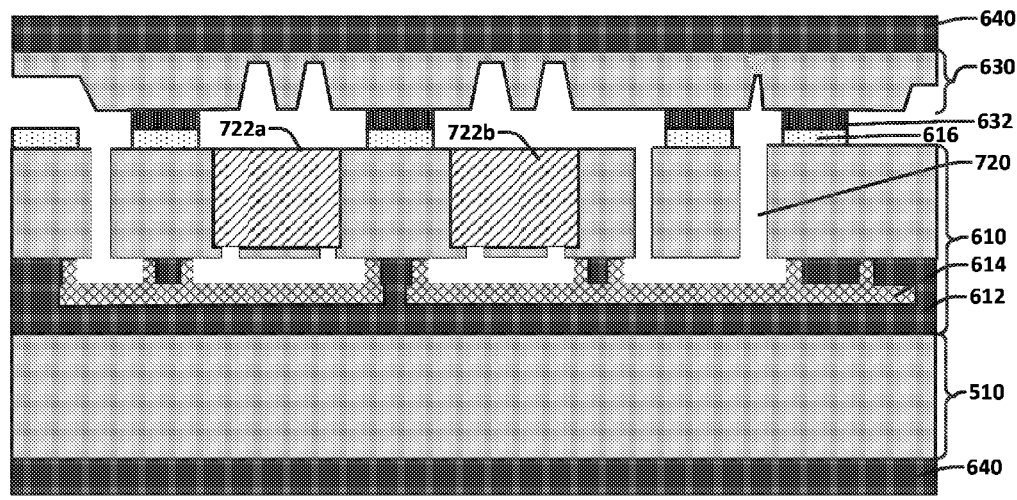

FIG. 7E shows an embodiment of a semiconductor body 700e after deposition of oxide 640 on the open sides of both the carrier wafer and the cap wafer. This is done to protect the silicon on both the ends of the carrier wafer and the cap wafer from the future etching step.

Figure 7F:
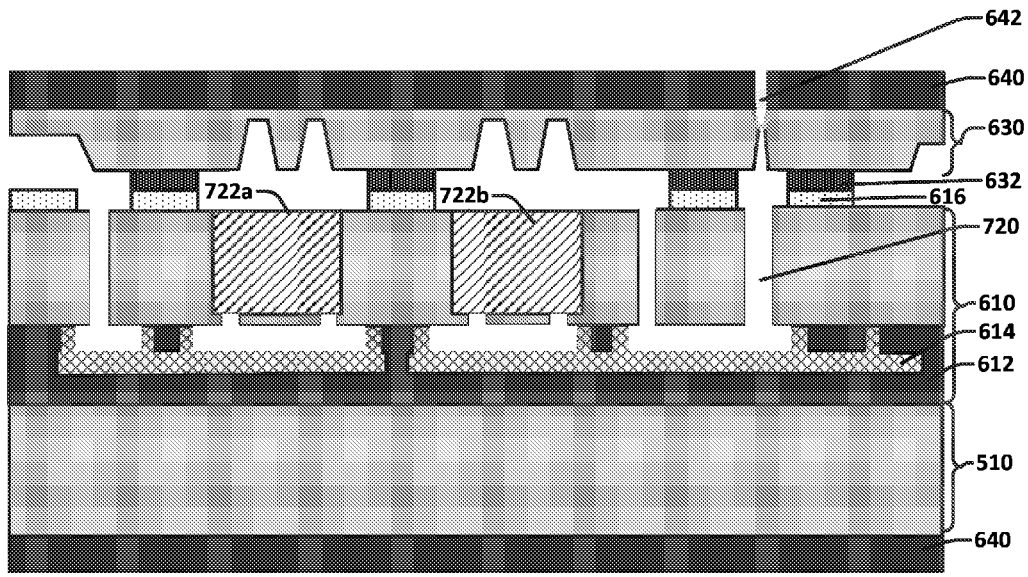

FIG. 7F shows an embodiment of a semiconductor body 700f after an anisotropic etching step that creates a small hole 642 on the cap wafer. This is the first step of a two-step etching process that creates a hole opening to the gas flow path which is in communication with the second MEMs device 722b.

Figure 7G:
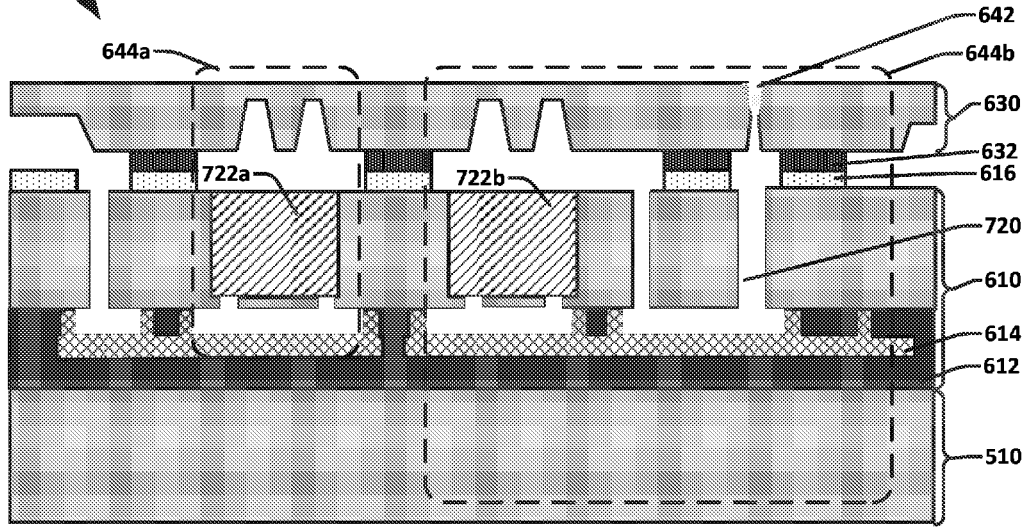

FIG. 7G shows an embodiment of a semiconductor body 700g after an isotropic etching step which completes the formation of the hole 642 in the cap wafer that creates an opening to the gas flow path 720 which is in communication with the second MEMs device 722b. The hole 642 in the cap wafer opens the gas flow path 720 to an ambient environment that is different from the existing pressure and the amount of pressure could be controlled externally through the hole 642 as well as by the volume of the gas flow path. Thus the initial pressure level formed during the bonding of the cap wafer around the second MEMs device is changed, creating two cavities 644a and 644b around the first MEMs device 722a and the second MEMs device 722b that have a first pressure level and a different second pressure level respectively.

Figure 7H:
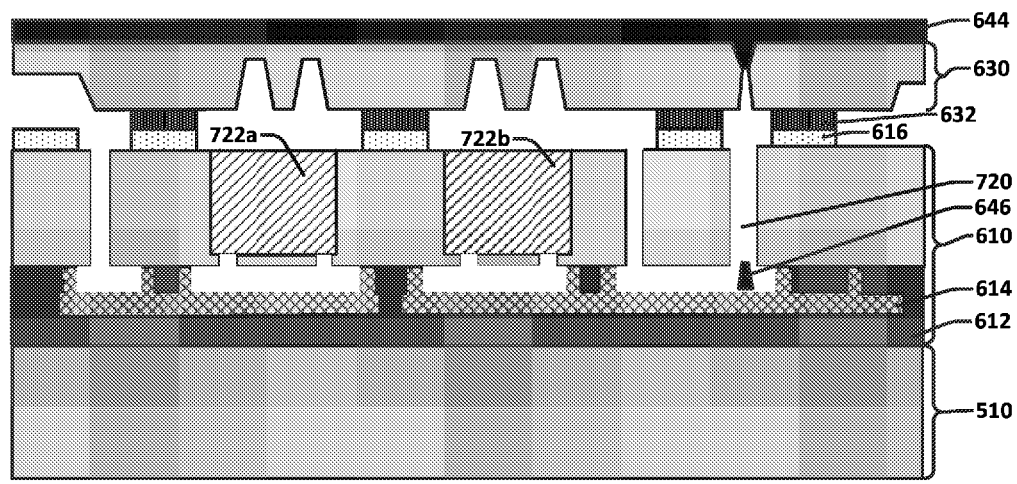

FIG. 7H shows an embodiment of a semiconductor body 700h after depositing a sealant 644 above the cap wafer 630 that seals the hole 642 and thus the second cavity 644b at a second different pressure level than that present in the first cavity 644a. Any residue that falls through the hole 642 into the second cavity will be collected at the bottom of the gas flow path and thus a sealant residue 646 is observed at the bottom of the gas flow path 720.

Figure 7I:
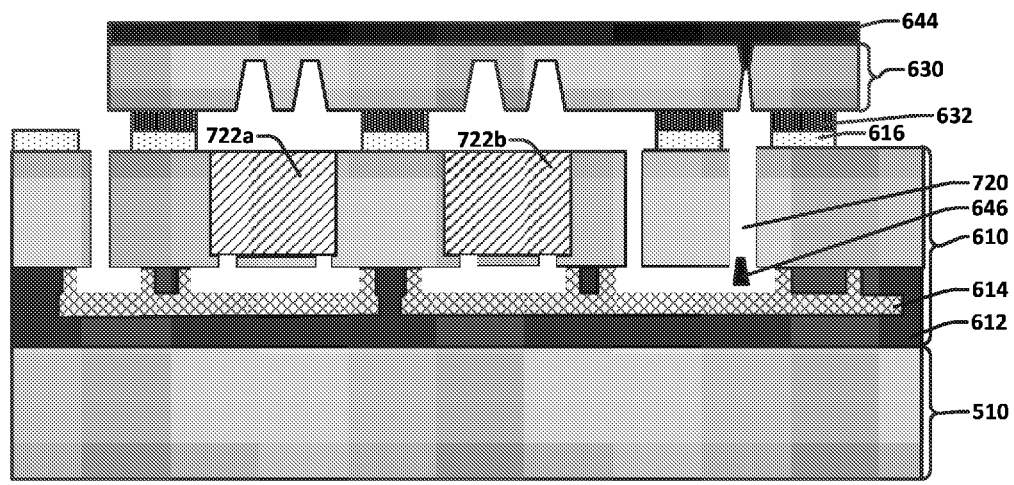

FIG. 7I shows an embodiment of a semiconductor body 700i after partial dicing of the cap wafer to expose one or more of the aluminum contacts 616 residing on top of the MEMs wafer 610.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein The present disclosure relates to a method of forming a plurality of MEMs devices, respectively having cavities with different pressures on a substrate, and an associated apparatus.

In some embodiments, the present disclosure relates to a wafer level packaging (WLP) structure comprising a work-piece including a silicon region and including first and second micro-electromechanical system (MEMs) devices thereon, first and second cavities disposed at least partially in the silicon region of the work-piece, and fluidly coupled to the first and second MEMs devices, respectively, wherein the first cavity retains a first pressure level and the second cavity retains a different second pressure level, a cap wafer over the work-piece, a gas flow path that fluidly couples the second cavity to an opening in the cap wafer, and a sealant in the opening in the cap wafer and sealing the gas flow path from an ambient environment external to the WLP.

In another embodiment, the present disclosure relates to a method of wafer level packaging (WLP) to form cavities with different pressure levels on a MEMS sensor, the method comprising forming a work-piece by bonding a MEMS wafer over a carrier wafer, forming one of more carrier wafer holes and corresponding carrier wafer paths in the carrier wafer, forming a first MEMs device and a second MEMs device on the MEMS wafer, forming a gas flow path adjacent the second MEMs device, by etching the MEMs wafer and opening a path connecting one of more of the carrier wafer paths, forming a first cavity and a second cavity on the work-piece by bonding a cap wafer over the work piece with eutectic bonds, wherein the first and second cavities are in fluid communication with the first MEMs device and the second MEMs device respectively, forming a hole in the cap wafer that opens to the gas flow path in the second cavity, and forming a sealing layer over the cap wafer and sealing the gas flow path from an ambient environment external to the wafer package system.

In yet another embodiment, the present disclosure relates to A method of wafer level packaging to form cavities with different pressure levels on a MEMs sensor, the method comprising forming a work-piece by fusion bonding a MEMs wafer over a carrier wafer, forming a first MEMs device and a second MEMs device on the MEMS wafer, forming a gas flow path adjacent the second MEMs device, by etching the MEMS wafer and creating an oxide releasing channel, forming a first cavity and a second cavity on the work-piece by bonding a cap wafer over the work-piece with eutectic bonds, wherein the first and second cavities are in fluid communication with the first MEMs device and the second MEMs device respectively, and wherein the first cavity retains a first pressure level and the second cavity retains a different second pressure level, forming a hole in the cap wafer that opens to the gas flow path in the second cavity, and forming a sealing layer over the cap wafer and sealing the gas flow path from an ambient environment external to the wafer package system.

What is claimed is:

1. A wafer level packaging (WLP) structure comprising:
   a work-piece including a silicon region and including first and second micro-electromechanical system (MEMs) devices thereon;
   first and second cavities-disposed at least partially in the silicon region of the work-piece, and fluidly coupled to the first and second MEMs devices, respectively, wherein the first cavity retains a first pressure level and the second cavity retains a different second pressure level;
   a cap work-piece over the work-piece;
   a gas flow path that couples the second cavity to an opening in the cap work-piece;
   a sealant in the opening in the cap work-piece and sealing the gas flow path from an ambient environment external to the WLP structure; and
   a sealing residue that resides at a bottom surface of the second cavity.

2. The WLP structure of claim 1, wherein the work-piece comprises a carrier work-piece and a MEMs work-piece overlying the carrier work-piece.

3. The WLP structure of claim 2, wherein the carrier work-piece comprises one or more carrier work-piece holes with corresponding carrier work-piece paths in communication with the second cavity.

4. The WLP structure of claim 2, wherein the MEMs work-piece comprises a MEMs semiconductor substrate layer and a MEMs oxide layer, and wherein the oxide layer is between the MEMs semiconductor substrate layer and the carrier work-piece.

5. The WLP structure of claim 1, wherein the cap work-piece and the work-piece are connected through eutectic bonds.

6. The WLP structure of claim 1, wherein the first pressure level comprises bonding pressure and the second pressure level comprises sealing pressure.

7. The WLP structure of claim 1, wherein the first MEMs device comprises an accelerometer or a magnetic sensor and the second MEMs device comprises a gyroscope, a magnetic sensor or an RF resonator.

8. A wafer level packaging (WLP) structure, comprising:
   a MEMs (microelectromechanical system) work-piece including a first MEMs device, a second MEMs device and a fluid path adjacent the second MEMs device;
   a carrier work-piece disposed under the MEMs work-piece, the carrier work-piece including a carrier work-piece fluid channel adjoining the fluid path and extending downward from an upper surface of the carrier work-piece to a carrier work-piece cavity within the carrier work-piece, wherein the carrier work-piece fluid channel has a first width that is less than a second width of the carrier work-piece cavity;
   a cap work-piece bonded to an upper surface of the MEMs work-piece to create a first cavity and a second cavity between the cap and MEMs work-pieces, wherein the first cavity is in fluid communication with the first MEMs device and the second cavity is in fluid communication with both the second MEMs device and the fluid path;
   a hole in the cap work-piece that opens to the fluid path; and
   a sealing layer over the cap work-piece to cover the hole and seal the fluid path from an ambient environment external to the WLP structure.

9. The WLP structure of claim 8, wherein the first cavity comprises a first pressure level and the second cavity comprises a second different pressure level.

10. The WLP structure of claim 8, wherein the MEMs work-piece comprises a MEMs oxide layer and a MEMs substrate.

11. The WLP structure of claim 10, wherein the MEMs oxide layer and the carrier work-piece are bonded by fusion bonding.

12. The WLP structure of claim 10, wherein the cap work-piece and the MEMs substrate are bonded by eutectic bonding.

13. The WLP structure of claim 8, further comprising, a sealing residue which resides at a bottom surface of the carrier work-piece cavity, directly under the hole in the cap work-piece.

14. The WLP structure of claim 8, wherein the carrier work-piece comprises more than two carrier work-piece cavities, wherein two or more of the carrier work-piece cavities are held at a same pressure.

15. A wafer level packaging (WLP) structure comprising:
   a MEMs (microelectromechanical system) work-piece including a first MEMs device, a second MEMs device, and a fluid path in fluid communication with the second MEMs device;

a carrier work-piece disposed under the MEMs work-piece, the carrier work-piece including a carrier work-piece fluid channel adjoining the fluid path and extending downward from an upper surface of the carrier work-piece to a carrier work-piece cavity within the carrier work-piece, wherein the carrier work-piece fluid channel has a first width and the carrier work-piece cavity has a second width which is greater than the first width;

a first cavity which is in fluid communication with the first MEMs device and a second cavity which is in fluid communication with the second MEMs device, wherein the first cavity retains a first pressure level and the second cavity retains a different second pressure level;

a cap work-piece disposed over the MEMs work-piece and coupled to the MEMs work-piece through eutectic bonding;

a hole in the cap work-piece that opens to one of the fluid paths in the MEMs work-piece; and a sealing layer over the cap work-piece to cover the hole and seal the one of the fluid paths from an ambient environment external to the WLP structure.

16. The WLP structure of claim 15, wherein the cap work-piece comprises Ge (germanium) contacts and the MEMs work-piece comprises Al (aluminum) contacts.

17. The WLP structure of claim 15, wherein the sealing layer comprises a metal.

18. The WLP structure of claim 15, wherein the first MEMs device comprises an accelerometer or a magnetic sensor and the second MEMs device comprises a gyroscope, a magnetic sensor or an RF resonator.

19. The WLP structure of claim 15, further comprising, a sealing residue which resides at a bottom surface of the carrier work-piece cavity, directly under the hole in the cap work-piece.

20. The WLP structure of claim 10, further comprising a third carrier work-piece fluid channel having an upper surface that abuts the MEMs oxide layer.

* * * * *